United States Patent
Wang et al.

(10) Patent No.: US 8,945,967 B2
(45) Date of Patent: Feb. 3, 2015

(54) PHOTOSENSITIVE IMAGING DEVICE AND METHOD FOR FORMING SEMICONDUCTOR DEVICE

(71) Applicant: Lexvu Opto Microelectronics Technology (Shanghai) Ltd, Shanghai (CN)

(72) Inventors: Zhiwei Wang, Shanghai (CN); Jianhong Mao, Shanghai (CN); Fengqin Han, Shanghai (CN); Lei Zhang, Shanghai (CN); Deming Tang, Shanghai (CN)

(73) Assignee: Lexvu Opto Microelectronics Technology (Shanghai) Ltd, Shanghai (CN)

( * ) Notice: Subject to any disclaimer, the term of this patent is extended or adjusted under 35 U.S.C. 154(b) by 0 days.

(21) Appl. No.: 13/836,346

(22) Filed: Mar. 15, 2013

(65) Prior Publication Data

US 2013/0240962 A1    Sep. 19, 2013

(30) Foreign Application Priority Data

Mar. 16, 2012 (CN) .......................... 2012 1 0071907

(51) Int. Cl.
*H01L 21/00* (2006.01)
*H01L 31/02* (2006.01)
*H01L 27/146* (2006.01)

(52) U.S. Cl.
CPC .... *H01L 31/02002* (2013.01); *H01L 27/14627* (2013.01); *H01L 27/1463* (2013.01); *H01L 27/14632* (2013.01); *H01L 27/14643* (2013.01); *H01L 27/14665* (2013.01)
USPC ................. 438/48; 438/69; 438/75; 438/455; 257/66; 257/290; 257/702; 257/E29.299

(58) Field of Classification Search
USPC ................... 257/66, 290, 432, 686, 702, 788, 257/E29.299; 438/69, 75, 455, 457–458
See application file for complete search history.

(56) References Cited

U.S. PATENT DOCUMENTS 7,759,156 B2   7/2010  Hwang
8,071,417 B2  12/2011  Kim
(Continued)

FOREIGN PATENT DOCUMENTS

CN   101483184 A   7/2009
CN   101640213 A   2/2010
CN   101840925 A   9/2010

OTHER PUBLICATIONS

State Intellectual Property Office of People's Republic of China Notification of the Third Office Action; Issue date, Jul. 16, 2014; Application No. 201210071907.8. Translation provided by Unitalen Attorneys at Law.
(Continued)

*Primary Examiner* — Mark A Laurenzi
(74) *Attorney, Agent, or Firm* — Harness, Dickey & Pierce, P.L.C.

(57) ABSTRACT

A photosensitive imaging device and a method for forming a semiconductor device are provided. The method includes: providing a first device layer formed on a first substrate, wherein a conductive top bonding pad layer is formed on the first device layer; providing a continuous second device layer formed on a second substrate, wherein a continuous conductive adhesion layer is formed on the continuous second device layer; bonding the first device layer with the second device layer, where the top bonding pad layer on the first device layer is directly connected with the conductive continuous adhesion layer on the continuous second device layer; removing the second substrate; selectively etching the continuous second device and the continuous conductive adhesion layer to form a groove array; and filling up the groove array with an insulation material to form a plurality of second devices. Alignment accuracy may be improved.

17 Claims, 9 Drawing Sheets

(56) References Cited

U.S. PATENT DOCUMENTS

2004/0266053 A1 12/2004 Varghese
2005/0040316 A1 2/2005 Holm et al.
2009/0085135 A1 4/2009 Bang
2010/0238331 A1 9/2010 Umebayashi et al.

OTHER PUBLICATIONS

First Chinese Office Action regarding Application No. 201210071907.8, dated Sep. 22, 2013. Partial translation provided by Unitalen Attorneys at Law.

# PHOTOSENSITIVE IMAGING DEVICE AND METHOD FOR FORMING SEMICONDUCTOR DEVICE

CROSS REFERENCE TO RELATED APPLICATIONS

The present application claims priority to Chinese patent application No. 201210071907.8 filed on Mar. 16, 2012 and entitled "Photosensitive Imaging Device and Method for Forming Semiconductor Device", the entire disclosure of which is incorporated herein by reference.

FIELD OF THE DISCLOSURE

The present disclosure generally relates to a photosensitive imaging device and a method for forming the same, and more particularly, to a method of high manufacturing precision, for forming a photosensitive imaging device having a high fill factor, and a photosensitive imaging device formed using the method. The present disclosure also relates to a method for forming a semiconductor device

BACKGROUND OF THE DISCLOSURE

Image sensor is a kind of device which can transform optical information into electrical signals. Currently, image sensors are widely used in camera shooting, image capturing, scanning, industrial measure, and the like. Existing image sensors may include charge-coupled-device (CCD) image sensors and complementary-metal-oxide-semiconductor (CMOS) image sensors.

A CCD image sensor may include a stack of a micro lens layer, a color filter layer and, a pixel unit array layer, e.g., photosensitive diodes. Incident lights may focus on the color filter layer through the micro lens layer, then reach the pixel units from the color filter. The pixel units may transform optical signals obtained from the incident lights into electrical signals, transfer the electrical signals through grids among the pixel units, and then output the electrical signals.

Compared with CCD image sensors, CMOS image sensors can be driven more conveniently and can implement various scanning modes. Furthermore, minimization of CMOS image sensors can be realized by integrating signal processing circuits into single chips. Besides, CMOS image sensors can be formed using widely compatible CMOS techniques, which may reduce the power consumption and manufacturing costs. Therefore, CMOS image sensors are used more widely.

Current CMOS image sensors may be classified into two kinds: front-side-illumination (FSI) image sensors and back-side-illumination (BSI) image sensors.

A FSI image sensor may be successively constituted by a stack of a micro lens layer, a color filter layer, a dielectric layer having an interconnection layer formed therein, and a layer including a pixel unit array and output circuit structures disposed in a same layer with the pixel unit array and electrically coupled to the pixel units. Lights incident to the FSI image sensor may be focused by the micro lens layer, having a anti-reflection coating formed thereon, onto the color filter layer and then reach the pixel units through the dielectric layer. The pixel units obtain optical signals, transform the optical signals into electrical signals, and output the electrical signals through a corresponding output circuit. In the FSI image sensor, an output circuit corresponding to each pixel unit may include two metal-oxide-semiconductor (MOS) units. As the lights reach the interconnection layer before the pixel units, and may be diffracted, absorbed and/or sheltered by metal and interdielectric layers in the interconnection layer, light absorption rate of the pixel units will be inevitably reduced. When the pixel units shrink to 1.1 micron scale or smaller, the reduction may severely affect the device's operation.

To address drawbacks of FSI image sensors, BSI image sensors are developed. A BSI image sensor may be constituted by a successively stack of a dielectric layer with an interconnection layer formed therein, a layer including a pixel unit array (i.e., pixel units) and output circuit structures electrically connected with the pixel units, a color filter layer and a micro lens layer. Lights illuminate from the backside of the BSI image sensor, then are focused onto the color filter layer by the micro lens layer having an anti-reflection coating formed thereon, and then reach the pixel units through the color filter layer. The pixel units may transform optical signals obtained from the incident lights into electrical signals, and corresponding output circuits may output the electrical signals. In a BSI image sensor, an output circuit corresponding to each pixel unit may include two MOS units.

However, those existing image sensors, including the CCD sensors, the FSI sensors and the BSI sensors, have drawbacks respectively.

Firstly, grids are needed to implement signal transmission among the pixel units in a CCD image sensor. The CCD image sensor may thereby have a reduced fill factor (a ratio of a photosensitive area to the whole device area) due to the grids. Besides, the grids may shelter the incident lights, resulting in a reduction of light usage. Therefore, the CCD image sensor may have relatively low sensitivity to incident lights. In a FSI or BSI image sensor, photosensitive pixel units and the MOS units of the output circuits are formed in a same layer, which may also limit the fill factor. Further, lights may be sheltered by an interconnection layer in the FSI, resulting in a reduction of light usage. Therefore, the FSI and BSI image sensors may also have relatively low sensitivity to incident lights.

Secondly, it is difficult to optimize the processing conditions of the pixel units in the CCD image sensor, due to the grids processes. For the FSI or the BSI image sensor, since their pixel units and MOS units are formed in a same process, it is also difficult to optimize the processing conditions of the pixel units, due to the limitation of thermal processes for forming the MOS units.

Thirdly, leakage current may occur between the grids and the pixel units in the CCD image sensor, which may also occur in conducting channels beneath the grids. In the FSI or BSI image sensor, leakage current may exist between the pixel units and the MOS transistor. Besides, there may be leakage current existing between the pixel units and the substrate, because normally isolating structures disposed between the pixel units may not be as deep as the pixel units.

Further, the CCD, FSI and BSI image sensors have relatively low resolution attributed to their manufacturing processes, e.g., low system integration degrees and relatively large packaging sizes due to necessity of being packaged with additional chips.

To avoid the drawbacks described above, for example, limitation in further scaling down due to relatively low fill factor, undesired performance due to multi-chip system packaging, high costs, low reliability and the like, three-dimensional contact image sensor (3D CIS) technology are rapidly developed in the field. The technology uses conventional CMOS manufacturing techniques or what are completely compatible with the CMOS manufacturing techniques. In the technology, a plurality of chips, having various functions or same functions, are stacked for bonding along a direction vertical to surface. However, 3D CIS technology still has drawbacks such as low yield and high cost. Therefore, there is need for a 3D CIS solution completely compatible with conventional CMOS manufacturing processes with simple manufacturing processes.

SUMMARY

According to one aspect of the present disclosure, a photosensitive imaging device and a method for forming the same are provided. The photosensitive imaging device may have a maximized fill factor, and photo diodes and corresponding drive circuits may be aligned precisely. According to another aspect of the present disclosure, a method for forming a semiconductor device is provided, which may provide a better alignment between an upper device layer and a lower device layer.

According to one embodiment of the present disclosure, a method for forming a semiconductor device is provided, including:

providing a first device layer formed on a first substrate and a continuous second device layer formed on a second substrate, wherein a conductive top bonding pad layer is formed on the first device layer, and a continuous conductive adhesion layer is formed on the continuous second device layer;

bonding the first device layer to the continuous second device layer, wherein the top bonding pad layer on the first device layer is directly connected to the conductive adhesion layer on the second device layer, to electrically coupling the first device layer with the second device layer;

removing the second substrate;

selectively etching the continuous second device layer and the continuous conductive adhesion layer to form a groove array; and filling the groove array with an insulating material to form a plurality of second devices separated and insulated from each other.

Optionally, the first device layer includes a plurality of drive circuits formed on the first substrate, where neighboring drive circuits are isolated by an insulating material; and the second device layer includes a continuous photosensitive unit layer.

Optionally, the material of the top bonding pad layer and the conductive adhesion layer are selected based on a standard that a thermal budget generated when bonding the first device layer to the second device layer doesn't damage components already formed.

Optionally, a heating temperature used when bonding the first device layer to the second device layer is not greater than 400° C.

Optionally, the top bonding pad layer includes Al, and the conductive adhesion layer includes Ge; or, both the top bonding pad layer and the conductive adhesion layer include Cu; or, a combination of the top bonding pad layer and the conductive adhesion layer is Au—In or Au—Si.

Optionally, before the first device layer is bonded to the second device layer, the top bonding pad layer is a continuous layer, when the continuous second device layer and the continuous conductive adhesion layer are selectively etched, the continuous top bonding pad layer is developed into a plurality of top bonding pads isolated from each other.

Optionally, the top bonding pad layer is developed into a plurality of top bonding pads isolated from each other before the first device layer is bonded to the second device layer.

Optionally, the top bonding pad layer is developed into a plurality of top bonding pads isolated from each other before the first device layer is bonded to the second device layer, where each top bonding pad includes two metal layers, an upper smaller metal layer used to be welded with the conductive adhesion layer of the second device layer, and a lower larger metal layer used as a light-reflection layer.

Optionally, the second substrate is removed using a dry etching process, a wet etching process or a polishing process.

Optionally, the photosensitive unit layer is a photo diode layer, and a stop layer is formed between the second substrate and the photo diode layer to avoid damaging the photo diode layer when removing the second substrate.

Optionally, the photosensitive unit layer is a photo diode layer, and an ion-implanting layer is formed between the second substrate and the photo diode layer, where removing the second substrate includes: separating the second substrate from the second device layer using the ion-implanting layer as an interface.

Optionally, both the first and second substrates are selected from a group consisting of silicon substrate and silicon-on-insulator substrate.

Optionally, the photosensitive unit layer is a photo diode layer which includes a P-type doping layer and a N-type doping layer, or includes a P-type doping layer, an I-type layer and a N-type doping layer, and the photo diode layer includes Si, Ge, SiC, GaAs, InP, or other semiconductor compound.

Optionally, the photosensitive unit layer is a photo diode layer; after the plurality of separated second devices are formed, a front electrode, a light-filter layer and a micro lens are formed on the photo diodes, where the front electrode is a nonopaque conductive oxide layer or a heavily-doped Ge layer.

Optionally, after the groove array is formed and before the insulation material is filled into the groove array, isolating ions are implanted into the photosensitive unit layer, so that the isolating ions are doped into portions of the photosensitive unit layer which are close to the sidewalls of the groove array.

Optionally, the first device layer is a drive circuit array and the second device layer is a memory array.

Optionally, the memory array includes NAND memory units or NOR memory units.

According to an embodiment of the present disclosure, a photosensitive imaging device is provided, including: a drive circuit array, disposed on a semiconductor substrate and including a plurality of drive circuits on a same plane, wherein each drive circuit includes at least a complementary metal oxide semiconductor (CMOS) transistor and a conductive top bonding pad above the CMOS transistor; and a photosensitive unit array, disposed on the drive circuit array and including a plurality of photosensitive units on a same plane, wherein a front electrode which allows lights to penetrate through is formed above the photosensitive units, and conductive adhesion pads are formed under the photosensitive units, wherein the conductive adhesion pads are connected with the top bonding pads to electrically couple the photosensitive units with the corresponding CMOS transistors, and isolating structures are formed between neighboring photosensitive units, the isolating structures isolate the conductive adhesion pads of the neighboring photosensitive units.

Optionally, the isolating structures isolate the top bonding pads above neighboring CMOS transistors.

Optionally, the top bonding pads include Al, and the conductive adhesion pads include Ge; or, both the top bonding pads and the conductive adhesion pads include Cu; or, a combination of the top bonding pads and the conductive adhesion pads is Au—In, or Au—Si.

Optionally, the semiconductor substrate includes monocrystalline silicon.

Optionally, the photosensitive units are photo diodes which include a stack of a P-type doping layer and a N-type doping layer, or a stack of a P-type doping layer, an I-type layer and a N-type doping layer, and the photo diode includes Si, Ge, SiC, GeAs, InP or other semiconductor compounds.

Optionally, the drive circuit array further includes interconnection structures between the CMOS transistors and the top bonding pads to electrically couple them, and the top bonding pads are on the surface of the interconnection structures.

Compared with conventional techniques, embodiments of the present disclosure have advantageous below:

First, the interconnection layer and the photosensitive array including the photo diodes are formed on a substrate in a formation process, while the drive circuit array including the field effect transistors is formed on another substrate in another formation process. Therefore, the photosensitive array is disposed at the outmost position and lights may directly gather on the photosensitive array through the lens layer. Besides, since the photosensitive array is formed on an individual layer, the photosensitive area may be maximized, thereby increasing the fill factor. Further, the photosensitive array is on top of the interconnection layer and the drive circuit array, thus incident lights may reach the photosensitive array without being sheltered. Therefore, light usage rate may be increased, which may improve the sensitivity of the photosensitive imaging device to the incident lights.

Second, the photosensitive array is formed individually on an individual layer. Therefore, the formation process may be optimized without being limited by other processes, which may increase the resolution.

Third, there is no leakage current between the photosensitive array and the drive circuits, because the photosensitive array is formed on an individual layer. Further, when the photosensitive array is separated, isolating structures formed therein may extend to the substrate on which the photosensitive array is formed. Therefore, a complete isolation between neighboring photo diodes may be obtained, which reduces or avoids the leakage current.

Fourth, the photosensitive array is formed individually on an individual layer, as such, processes for forming the photosensitive array may not be affected by other processes, which may result in high resolution and the photosensitive array may not be packaged with additional chips. System integration may be simplified and packaging dimensions may be minimized.

Fifth, since the drive circuit array and the photosensitive unit array are not formed on a same plane, the drive circuit for each photosensitive unit may implement more functions, for example, amplifying and processing photoelectric signals generated in the photosensitive unit.

Sixth, the formation processes are simplified, where only one wafer level bonding is required, and there is no need to thin substrates and transfer devices. Therefore, manufacturing costs may be reduced and yield may be improved.

Further, the photosensitive unit array is developed into isolated photosensitive units, i.e., photo diodes, after being bonded with the drive circuit array. Compared with the conventional bonding-after-separating approach, a more precise alignment may be obtained with a same machine precise. Therefore, manufacturing costs and difficulty may be reduced. Besides, a three-dimensional (3D) structure is formed using the method provided by the present disclosure, which may simplify the manufacturing process, improve the device performance and shorten the production cycle. Since the whole 3D structure can be packaged in a single chip, device dimensions may be reduced.

BRIEF DESCRIPTION OF THE DRAWINGS

The above described and other features and advantages will become more apparent to those of ordinary skill in the art by describing in detail exemplary embodiments with reference to the attached drawings.

DETAILED DESCRIPTION OF THE DISCLOSURE

In order to clarify the objects, characteristics and advantages of the disclosure, embodiments of the disclosure will be interpreted in detail in combination with accompanied drawings.

The present disclosure is disclosed hereinafter with reference to preferred embodiments in detail, it also can be implemented in other different embodiments and those skilled in the art may modify and vary the embodiments without departing from the spirit and scope of the present disclosure. Therefore, the present disclosure should not be limited by the embodiments disclosed herein.

Figure 1:
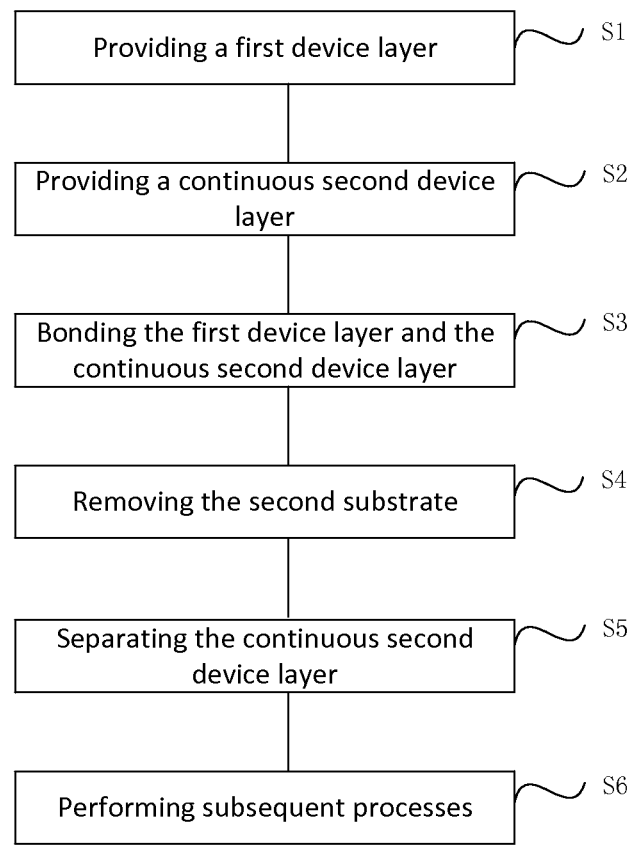
FIG. 1 schematically illustrates a flow chart of an exemplary method for forming a semiconductor device according to various embodiments of the present disclosure.

FIG. 1 schematically illustrates a flow chart of an exemplary method for forming a semiconductor device according to various embodiments of the present disclosure. The method and intermediate structures formed therein will be illustrated in detail with reference to FIG. 1. A photosensitive imaging device is to be formed using the method, which is merely an example for illustrating.

Referring to FIG. 1, performing step S1: providing a first device layer.

Figure 2:
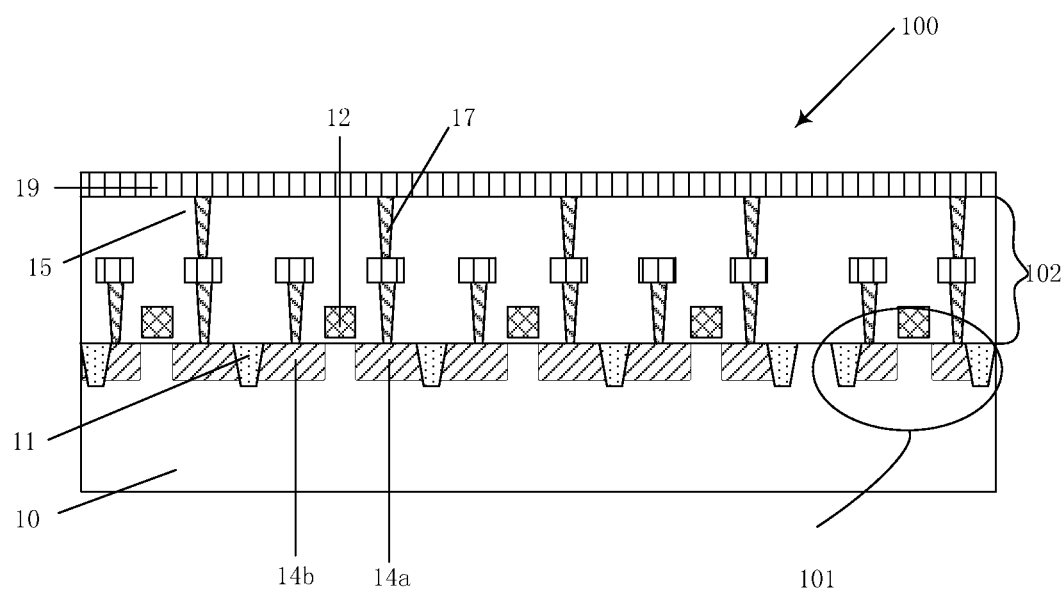
FIGS. 2 to 13 schematically illustrate cross-sectional views of intermediate structures formed in a process for forming a semiconductor device according to various embodiments of the present disclosure.

As shown in FIG. 2, a first device layer 100, formed on a first substrate 10, is provided. In some embodiments, the first device layer 100 may include a drive circuit array, including a plurality of CMOS transistors 101 constituting the drive circuits. The CMOS transistors 101 are formed on the first substrate 10. Neighboring drive circuits are isolated with insulating materials (e.g., shallow trench isolating structures 11 and a dielectric layer 15). A conductive top bonding pad layer 19 is formed on the drive circuits.

Each of the transistors may include a gate 12 formed on the first substrate 10, a source 14a and a drain 14b formed in the first substrate 10 and on opposing two sides of the gate 12. The top bonding pad layer 19 is electrically coupled to the transistors through interconnection structures 17. The first substrate 10 may be a monocrystalline silicon substrate, a silicon-on-insulator (SOI) substrate or any substrate commonly used in the art.

In some embodiments, the drive circuits of the first device layer may include other field effect transistors, e.g., diodes, bipolar junction transistors, or a combination thereof; the drive circuits may include field effect transistors and other devices, e.g., a combination of passive devices.

In some embodiments, the drive circuits may further include an interconnection layer 102, including the interconnection structures 17 and the dielectric layer 15, formed on the CMOS transistors. The top bonding pad layer 19 is disposed on the interconnection layer.

Referring to FIG. 1, performing step S2: providing a continuous second device layer.

Figure 3:
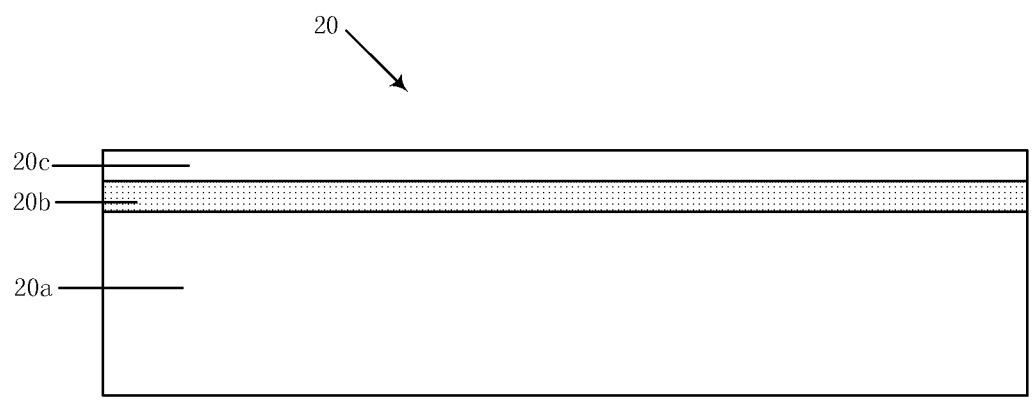

Specifically, a second substrate 20 is provided. In some embodiments, as shown in FIG. 3, the second substrate 20 may be a SOI substrate including a bottom silicon layer 20a, a buried oxide layer 20b on the bottom silicon layer 20a, and a top silicon layer 20c on the buried oxide layer 20b. In some embodiments, the second substrate may be selected from other substrates, for example, the second substrate may be a monocrystalline silicon substrate, a lightly-doped silicon or silicon germanium substrate, or the like.

Figure 4:
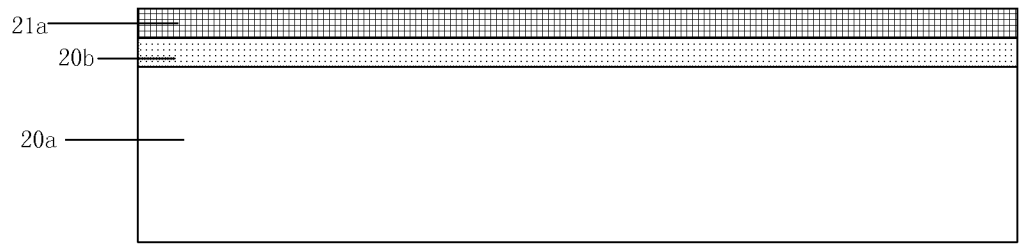
Figure 5:
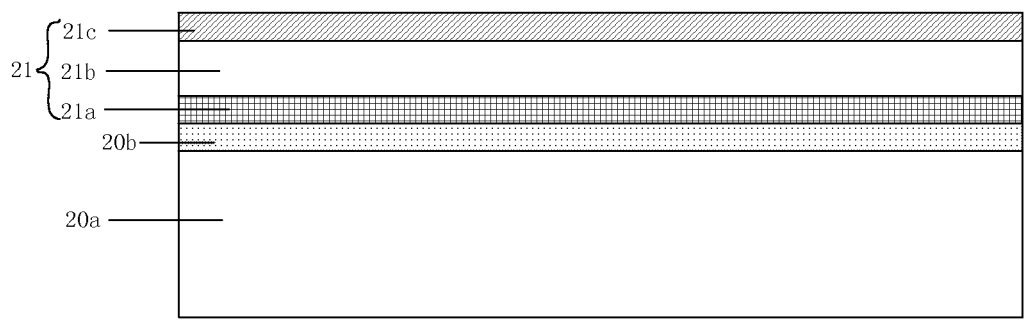
Figure 6:
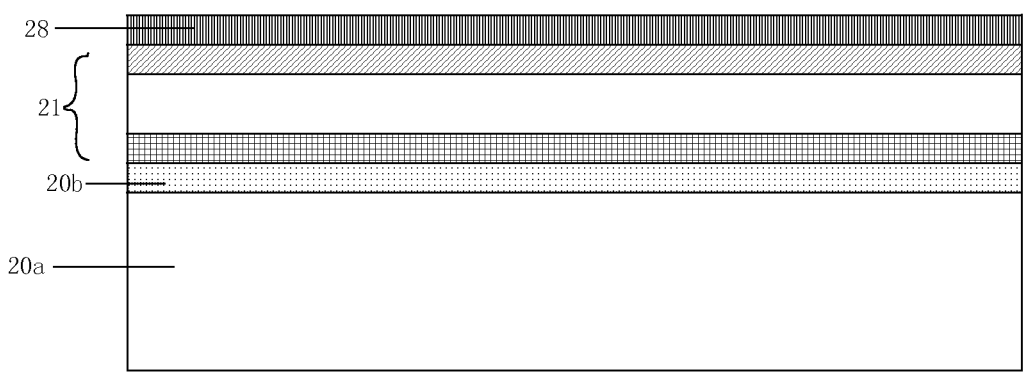

Then, a photosensitive unit layer is formed on the second substrate 20. Specifically, in some embodiments, the photosensitive unit layer may include a photo diode layer 21 and a conductive adhesion layer 28, as illustrated in FIGS. 4 to 6. The photo diode layer 21 may include a stack of a P-type doping layer and a N-type doping layer, or a stack of a P-type doping layer, an I-type layer and a N-type doping layer. Furthermore, the photo diode layer 21 may mainly include Si, Ge, SiC, GaAs, InP, or any other material which may be used in photo diodes.

In some embodiments, a heavily-doped P-type silicon layer 21a is formed by doping and activating the top silicon layer 20c, as shown in FIG. 4. A lightly-doped P-type silicon layer 21b is formed on the heavily-doped P-type silicon 21a using epitaxial growth, and followed by forming a heavily-doped N-type silicon layer 21c on the light-doped P-type silicon layer 21b using in-situ doping or activating after doping, as shown in FIG. 5. The above described heavily-doped P-type silicon layer 21a, lightly-doped P-type silicon layer 21b and heavily-doped N-type silicon layer 21c constitute the continuous photo diode layer 21 which is to be developed into a plurality of photo diodes insulated with each other in subsequent processes.

The conductive adhesion layer 28 is formed on the photo diode layer 21 in order to implement electrical connection, which is shown in FIG. 6.

In some embodiments, the second device layer may have a main structure including other photosensitive units other than photo diodes.

It should be noted that, the continuous second device layer will be developed into a plurality of independent units subsequently. "Continuous" here only means that the second device layer has not been separated yet, which is not intending to limit the scope of the present disclosure.

Besides, the above described sequence of step S1 and step S2 could be altered. For example, the first and second device layers may be formed using different apparatus at the same time, or formed successively. Which one of the first and second device layers is formed preferentially is not limiting.

Referring to FIG. 1, performing step S3: bonding the first device layer with the second device layer.

Figure 7:
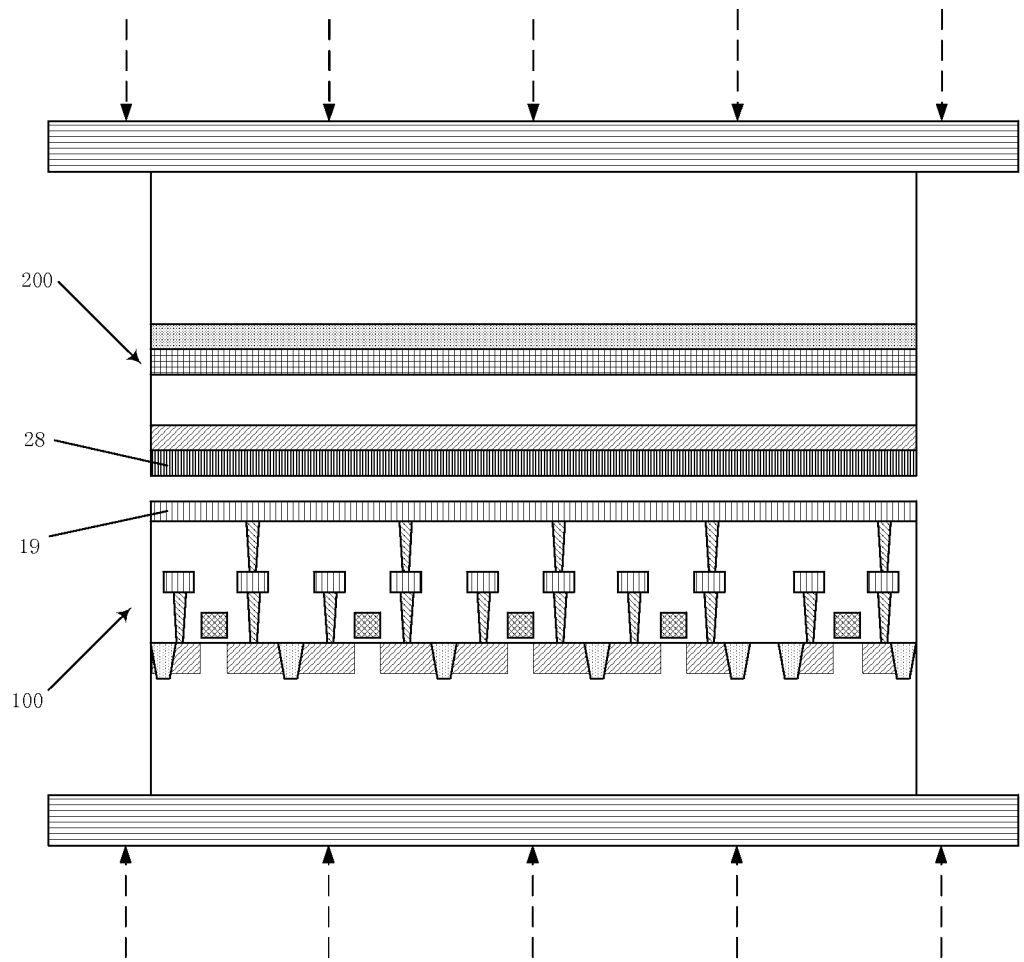

As shown in FIG. 7, the top bonding pad layer 19 of the first device layer 100 and the conductive adhesion layer 28 of the second device layer 200 are disposed face to face or in contact with each other.

Figure 8:
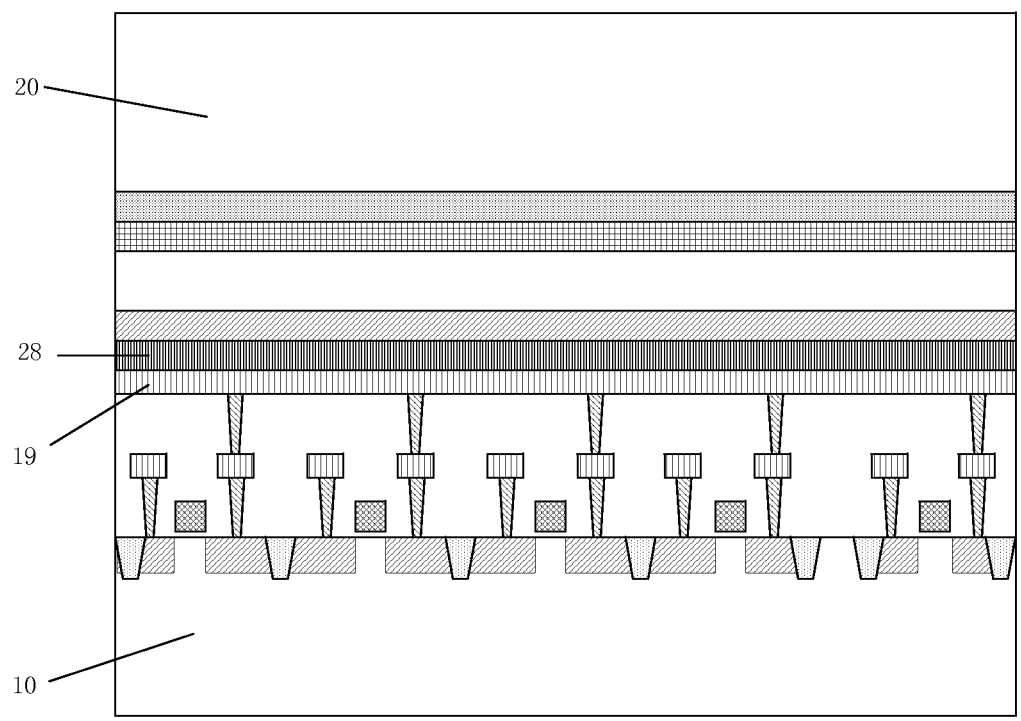

Thereafter, as shown in FIG. 8, the first device layer 100 and the second device layer 200 are bonded with each other. In some embodiments, the top bonding pad layer 19 of the first device layer 100 is directly welded to the conductive adhesion layer 28 of the second device layer 200, which electrically couples the first device layer 100 and the second device layer 200.

The bonding may be implemented using eutectic bonding or any other bonding method which is practical in a semiconductor manufacturing process. The key point of the bonding is to achieve a firm welding with an acceptable heat budget, since a too large heat budget may damage the components formed in the first device layer 100 and the second device layer 200. The heat budget is relative to the material of the top bonding pad layer 19 of the first device layer 100 and the material of the conductive adhesion layer 28 of the second device layer 200.

For a photosensitive imaging device, the first device layer 100 and the second device layer 200 thereof may not be damaged if they are not heated to a processing temperature higher than 500° C., preferably, higher than 440° C. With this range of heat budget, the photosensitive imaging device may have ideal performance.

To meet the requirement of heat budget, in some embodiments, the top bonding pad layer 19 may include Al, accordingly, the conductive adhesion layer 28 may include Ge. In some embodiments, the top bonding pad layer 19 and the conductive adhesion layer 28 may include Cu. In some embodiments, the top bonding pad layer 19 and the conductive adhesion layer 28 may include Au—In, Au—Si or other eutectic alloys compatible with the heat budget. Among the above illustrated practical examples, employing Al and Ge may have additional benefits. The top bonding pad layer 19, including Al and disposed under the photo diode layer, can reflect lights back to the photo diodes as Al is an ideal light-reflection material. Therefore, the photosensitive imaging device may have an improved light sensitivity.

Referring to FIG. 1, performing step S4: removing the second substrate.

Figure 9:
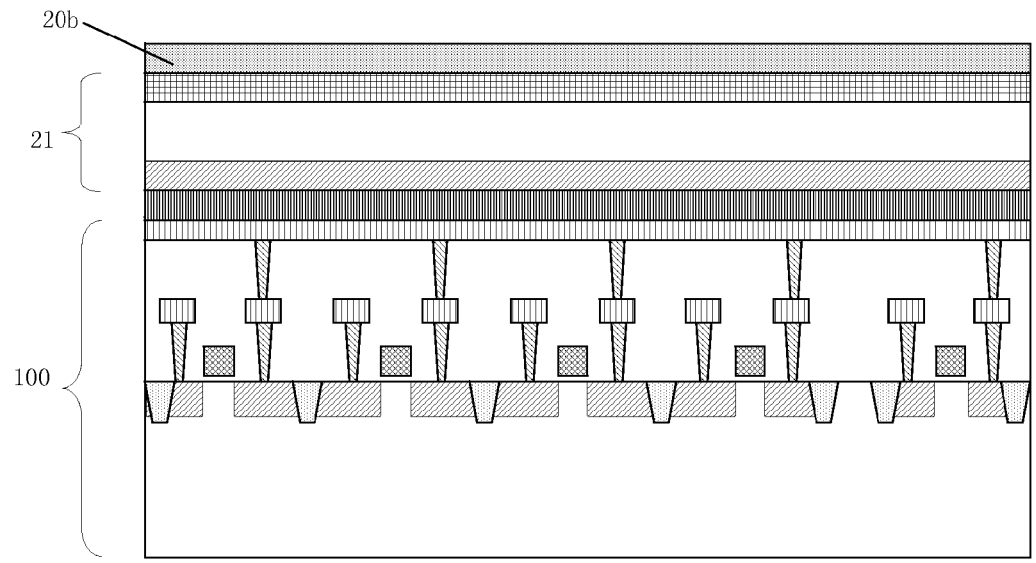

In some embodiments, as shown in FIG. 9, the bottom silicon layer 20a (not shown in FIG. 9) is removed using a dry etch process, a wet etch process or a polishing process, where the buried oxide layer 20b of the SOI substrate (i.e., the second substrate) as a stop layer. The second substrate 20 has a multi-layer structure and only a majority part thereof is removed, that is because the remaining part of the second substrate will not affect the subsequent processes (e.g., separating the photo oxide layer 21), in fact, the remaining part can protect the photo diodes subsequently. However, after the photosensitive imaging device is formed, the remaining part may be removed to ensure that incident lights can reach to the photo diodes without or substantially without being obstructed.

In some embodiments, the second substrate has a single-layer structure, e.g., it is a monocrystalline silicon substrate. Accordingly, the second substrate may be completely removed in step S4. Or else, in some preferable embodiments, a stop layer which functions as the buried oxide layer 20b in the SOI substrate may be formed between the second substrate and the photo diode layer 21 in advance, thus the second substrate may be partially removed to avoid damaging the photo diode layer 21.

Except for the above described processes, in which the second substrate is consumed gradually, other processes may be used to remove the second substrate, in which the second substrate may be completely peeled off using mechanical or physical operations. In some embodiments, some treatments may be applied to reduce the joint strength between the second substrate and the photo diode layer, thus the second substrate may be more easily peeled off. For example, an ion-implanting layer may be formed under a surface of the second substrate and then the photo diode layer may be formed on the surface. To remove the second substrate, a majority part of the second substrate may be separated from the ion-implanting layer with a force, thereafter, there is only need to remove the remaining ion-implanting layer left on the photo diode layer, for example, using a wet etch process.

Referring to FIG. 1, performing step S5: separating the second device layer.

Figure 10:
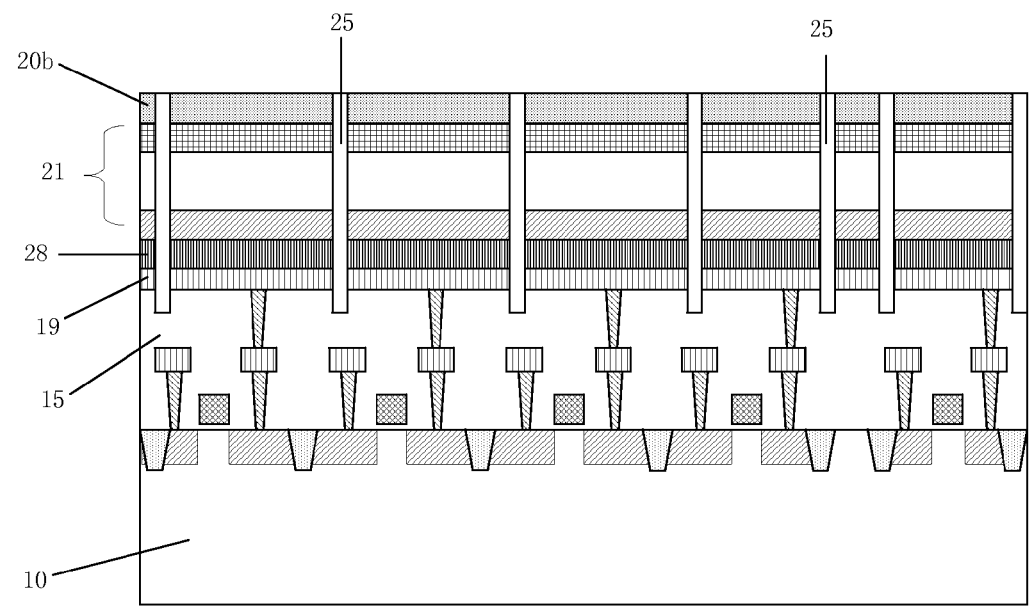

As shown in FIG. 10, a groove array including a plurality of grooves is formed by successively etching through the buried oxide layer 20b, the photo diode layer 21, the conductive adhesion layer 28 and the top bonding pad layer 19 and partially etching the dielectric layer 15.

Figure 11:
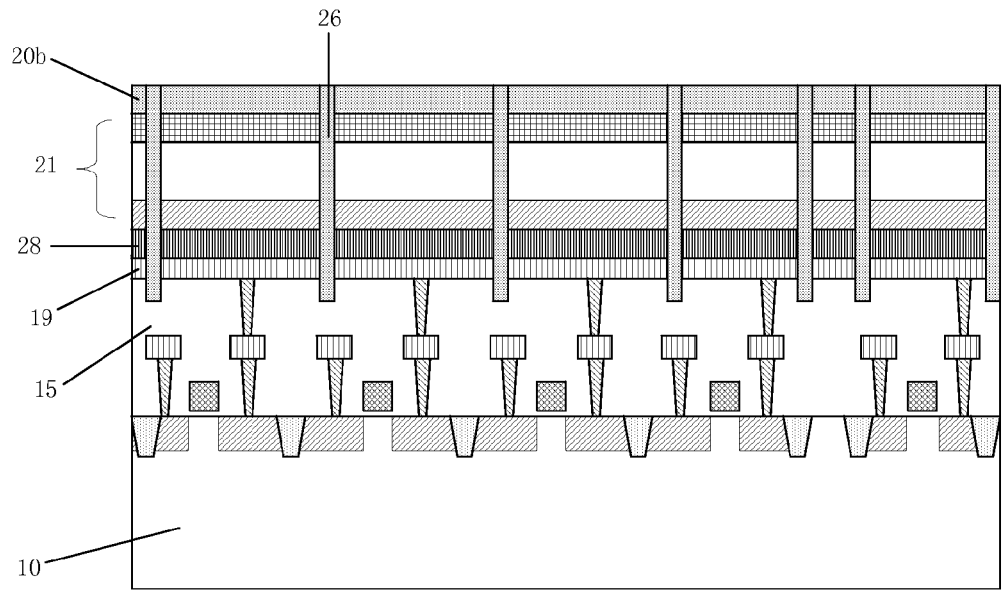
Figure 12:
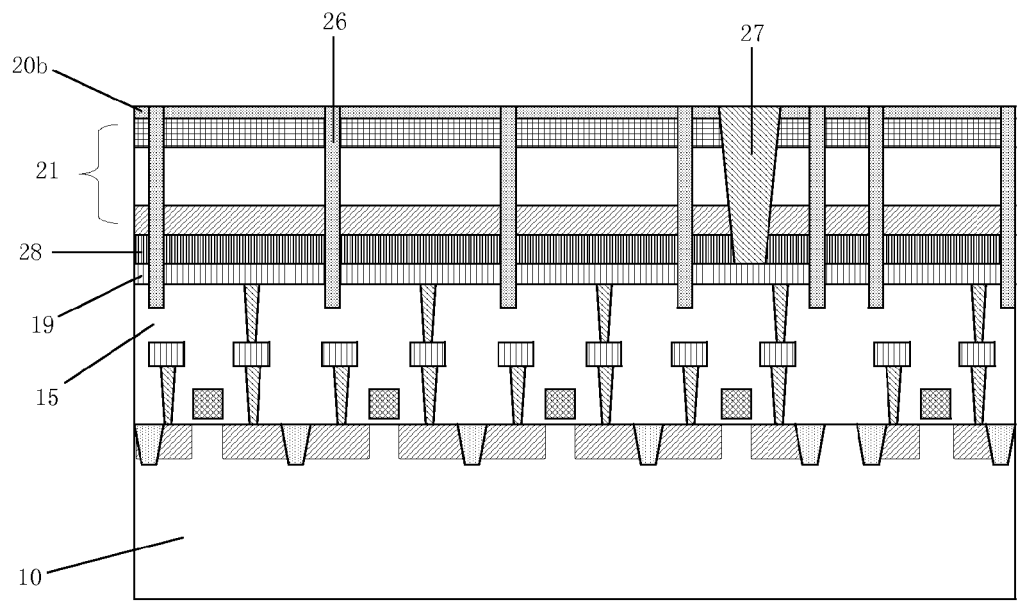

As shown in FIG. 11, the grooves 25 are filled up with an insulation material using deposition, for example, sub-atmospheric chemical vapor deposition, so as to form isolating structures 26 in the grooves 25. Thereafter, a chemical mechanical polishing process may be performed to obtain a planar surface, as shown in FIG. 12. The isolating structures 26 separate the photo diode layer 21 into a plurality of isolated photo diodes. Each photo diode is corresponding to a drive circuit (i.e., a transistor) under itself. Furthermore, the isolating structures 26 separate the conductive adhesion layer 28 into a plurality of conductive adhesion pads and separate the top bonding pad layer 19 into a plurality of top bonding pads.

An improved alignment may be achieved by bonding the first and second device layers prior to separating the second device layer. In light of this, the transistors in the first device layer and the photo diodes in the second device layer may be better aligned, and thus effectively electrically coupled. The alignment error may be controlled within about 1.5 microns. Under the same processing precision, current solutions, in which the first and second device layers may be respectively separated and then bonded by aligning bonding pads with adhesion pads formed thereon, may have an alignment error larger than about 3 microns.

Further, after the groove array is formed and before the insulation material is filled into the groove array, isolating ions may be implanted into the photo diode layer through sidewalls of the groove array, so that the isolating ions may be doped into portions of the photo diode layer which are close to the sidewalls. The photo diodes can be better insulated with the isolating ions, which may reduce the leakage current. Besides, the dark current of the photosensitive units may be reduced, which may improve the device performance.

Referring to FIG. 1, performing step S6: performing subsequent processes.

As shown in FIG. 12, the buried oxide layer 20b, the photo diode layer 21 and the conductive adhesion layer 28 are successively etched within a selected area to form a groove exposing a part of a top bonding pad in the top bonding pad layer 19. Then the groove is filled up with metal to form a front electrode contact hole 27. Then the metal on the buried oxide layer 20b is removed to planar the surface. In some embodiments, the metal may be W.

Figure 13:
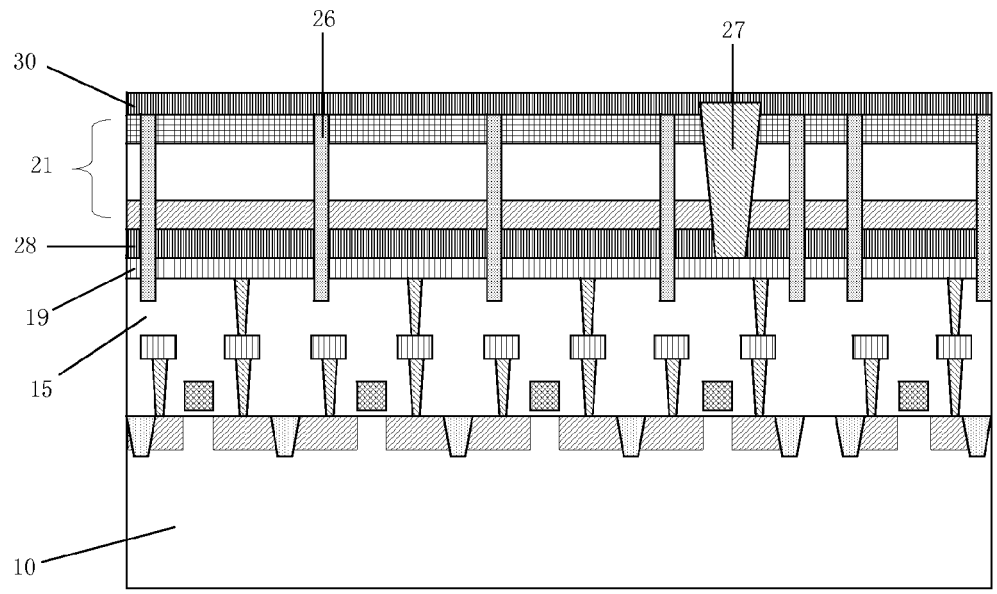

Thereafter, as shown in FIG. 13, the buried oxide layer 20b is removed to expose the photo diodes in the photo diode layer 21, and a nonopaque front electrode 30 is formed on the photo diodes. The front electrode 30 is electrically coupled to the corresponding drive circuits (i.e., the transistors) through the front electrode contact hole 27. In some embodiments, the front electrode 30 may be a nonopaque conductive oxide layer, for example, an indium tin oxide (ITO) layer, or may be a heavily-doped Ge layer with a thickness less than 0.5 microns.

Figure 14:
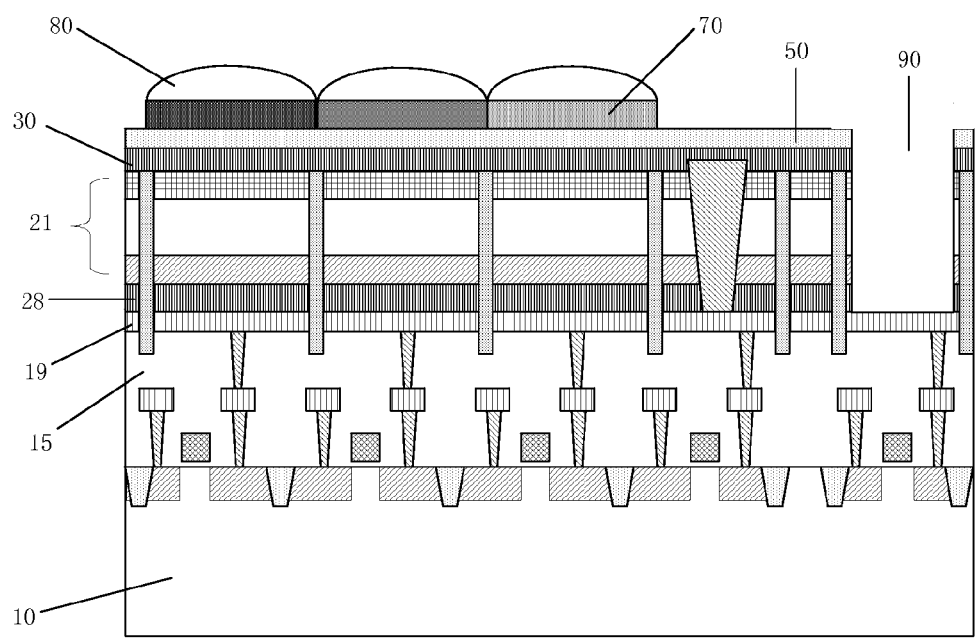
FIG. 14 schematically illustrates a cross-sectional view of a semiconductor device provided according to various embodiments of the present disclosure.

As shown in FIG. 14, to enhance gathering and absorbing incident lights of the photo diodes, an anti-reflection layer 50 is formed on the front electrode 30, a light-filter layer 70 is formed on the anti-reflection layer 50, and micro lenses 80 are formed on the light-filter layer 70. Portions of the light-filter layer 70, the anti-reflection layer 50, the photo diode layer 21 and the conductive adhesion layer 28 which are in marginal regions of the device are successively etched to expose a top bonding pad in the top bonding pad layer 19, so that the device may be coupled to external components.

Detail structures and formations of the above described front electrode 30, anti-reflection layer 50, light-filter layer 70 and micro lenses 80 are well known in the art. In some embodiments, other structures and formation methods may be applied. For example, the light-filter layer may include three layers to respectively filter RGB lights, which may have a common rectangular configuration, triangular configuration, or other regular or irregular configuration.

A photosensitive imaging device is formed using the above described method. Referring to FIG. 14, the device includes a drive circuit array and a photosensitive array.

The drive circuit array, including a plurality of drive circuits on a same plane, is formed on a semiconductor substrate (i.e., a first substrate) 10. Each drive circuit includes at least a field effect transistor and a conductive top bonding pad 19 above the field effect transistor.

The photosensitive array 21, including a plurality of photosensitive units on a same plane, is formed on the drive circuit array. The photosensitive units may be photo diodes. A front electrode 30 which allows light to penetrate through is formed on the photo diodes. Conductive adhesion pads 28 are formed under the photo diodes.

The conductive adhesion pads 28 are respectively welded with the top bonding pads 19 to electrically couple corresponding photo diodes with corresponding field effect transistors. Isolating structures 26 are formed between neighboring photo diodes, which isolate the conductive adhesion pads 28 corresponding to the neighboring photo diodes.

In some embodiments, the isolating structures 26 may further isolate the top bonding pads 19 above the neighboring field effect transistors.

In some embodiments, the top bonding pads 19 may include Al, and the conductive adhesion pads 28 may include Ge. In some embodiments, the top bonding pad 19 and the conductive adhesion pads 28 may include Cu. In some embodiments, the top bonding pad 19 and the conductive adhesion pads 28 may include may include Au—In or Au—Si.

In some embodiments, the field effect transistors may be CMOS transistors, diodes, bipolar junction transistors, or a combination thereof.

In some embodiments, the photo diodes may be P-N type. In some embodiments, the photo diodes may be P-I-N type. In some embodiments, the photo diodes may include Si, Ge, SiC, GaAs or InP.

In some embodiments, a light-filter layer 70 and micro lenses 80 are formed on the front electrode 30.

Compared with current techniques, embodiments of the present disclosure may have following advantageous.

First, the interconnection layer and the photosensitive array including the photo diodes are formed on a substrate in a formation process, while the drive circuit array including the field effect transistors is formed on another substrate in another formation process. Therefore, the photosensitive array is on an outmost layer and lights may directly gather on the photosensitive array through the lens layer. Besides, since the photosensitive array is formed on an individual layer, the photosensitive area may be maximized, thereby increasing the fill factor. Further, the photosensitive array is on top of the interconnection layer and the drive circuit array, thus incident lights may strike on the photosensitive array without being obstructed. Therefore, light usage rate may be increased, which may improve the sensitivity of the photosensitive imaging device to the incident lights.

Second, the photosensitive array is formed individually on an individual layer. Therefore, the formation process may be optimized without being limited by other processes, which may increase the resolution.

Third, there is no leakage current between the photosensitive array and the drive circuits, because the photosensitive array is formed on an individual layer. Further, when the photosensitive array is separated, isolating structures formed therein may extend to the substrate on which the photosensitive array is formed. Therefore, a complete isolation between neighboring photo diodes may be obtained, reducing or avoiding the leakage current.

Fourth, the photosensitive array is formed individually on an individual layer, so it doesn't need to be packaged with additional chips. System integration may be simplified and packaging dimensions may be minimized.

Fifth, the separating after bonding approach simplifies the manufacturing process. Alignment between the photo diode array and the drive circuit array may be improved.

Figure 15:
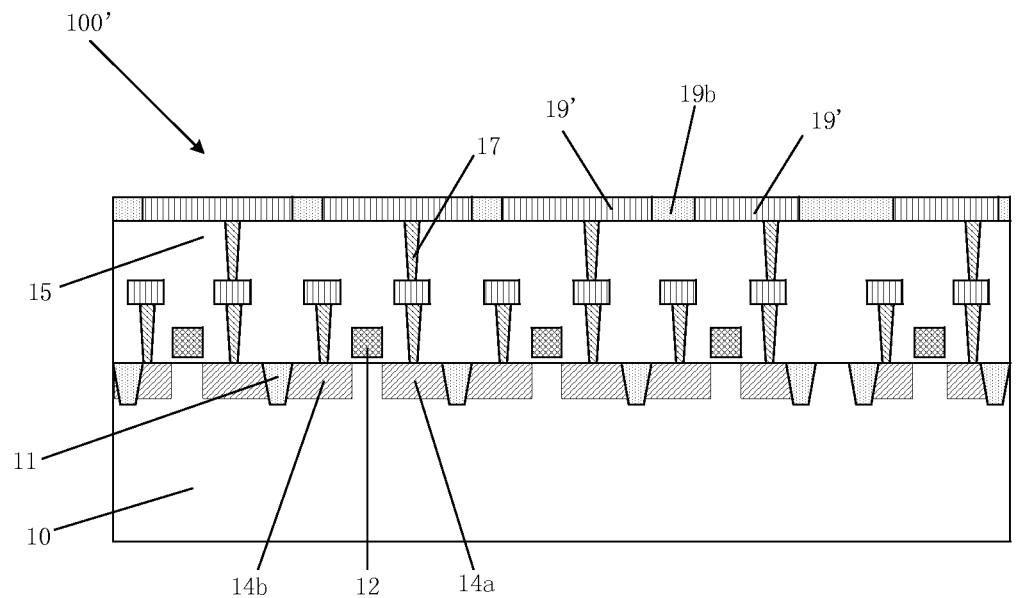
FIG. 15 schematically illustrates an exemplary structure of a first device layer according to one embodiment of the present disclosure.

FIG. 15 schematically illustrates an exemplary structure of a first device layer 100' according to one embodiment of the present disclosure. Compared with the first device layer 100 shown in FIG. 2, a top bonding pad layer of the first device layer 100' is developed into a plurality of top bonding pads 19' before the first device layer 100' is bonded with the second device layer. Neighboring top bonding pads 19' are insulated by insulation structures 19b.

Forming the plurality of top bonding pads 19' isolated with each other may including: forming a continuous top bonding pad layer, etching the top bonding pad layer to form grooves therein, and filling the grooves with an insulation material; or other processes, e.g., a damascene process which is preferably used when the top bonding pad layer includes Cu or other material which is not easy to etch.

Specifically, as shown in FIG. 15, the first device layer 100' includes a plurality of CMOS transistors (not labeled in FIG. 15) used as drive circuits formed on the first substrate 10, where neighboring drive circuits are isolated by insulation structures (i.e., the STI structures 11 and the dielectric layer 15). The plurality of conductive top bonding pads 19' are formed on the drive circuits. Each of the transistors includes the gate 12 on the first substrate 10, the source 14a and the drain 14b in the first substrate 10 and on opposing two sides of the gate 12. The top bonding pads 19' are electrically coupled to the transistors through the interconnection structure 17. The first substrate 10 may be a monocrystalline silicon substrate, a SOI substrate or other substrate commonly used in the art.

In subsequent processes, after the first device layer 100' and the second device layer are bonded, the continuous second device layer and the continuous conductive adhesion layer are selectively etched to form the groove array, where the top bonding pads of the first device layer 100' is not to be etched.

Figure 16:
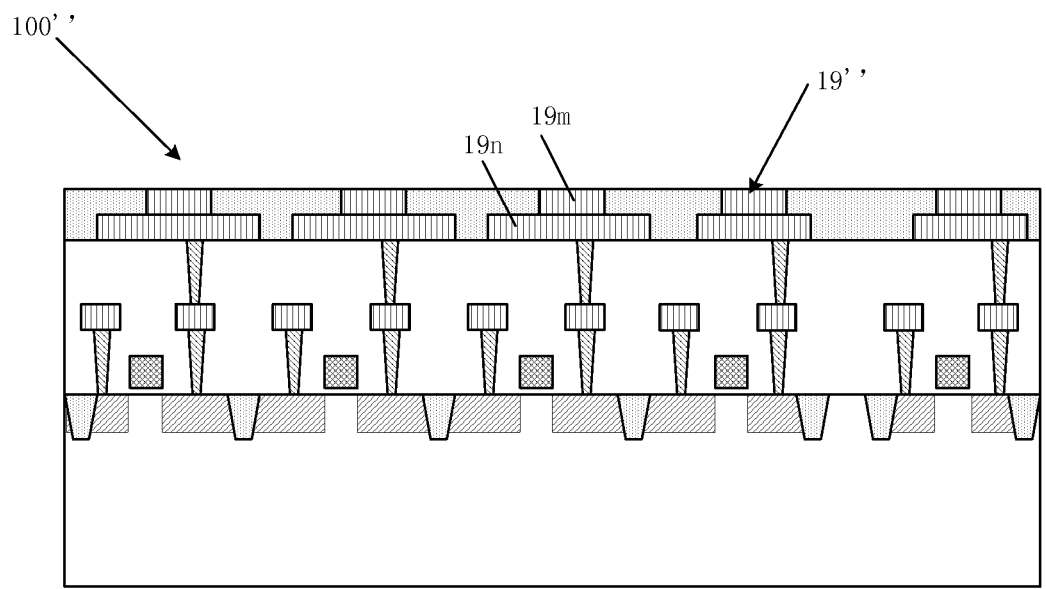
FIG. 16 schematically illustrates another exemplary structure of a first device layer according to one embodiment of the present disclosure.

FIG. 16 schematically illustrates another exemplary structure of a first device layer 100" according to one embodiment of the present disclosure. Compared with the first device layer 100', each top bonding pad 19" of the first device layer 100" includes two metal layers, an upper metal layer 19m which is smaller is used to be welded with the conductive adhesion layer of the second device layer, and a lower metal layer 19n which is bigger is used as a anti-reflection layer to enhance the light absorption of the corresponding photo diode. The upper metal layer 19m may have a material selected within a same range as the top bonding pad layer 19 shown in FIG. 2, and the lower metal layer 19n needs to include a reflection material, such as Al.

The above described bonding method may be used to form other semiconductor devices.

In some embodiments, a memory device is to be formed. Accordingly, the first device layer may be a drive circuit array including CMOS read and write circuits, and the second device layer may be a memory array including NAND memory units or NOR memory units. Preferably, before bonding the first and second device layers, both of them are developed into multiple units.

A three-dimensional (3D) structure is formed using the method provided by the present disclosure, which may simplify the manufacturing process, improve the device performance and shorten the production cycle. Besides, the whole 3D structure can be packaged in a single chip, thereby reducing the device dimensions.

The disclosure is disclosed, but not limited, by preferred embodiments as above. Based on the disclosure of the disclosure, those skilled in the art can make any variation and modification without departing from the scope of the disclosure. Therefore, any simple modification, variation and polishing based on the embodiments described herein is within the scope of the present disclosure.

What is claimed is:

1. A method for forming a semiconductor device, comprising:
    providing a first device layer formed on a first substrate, wherein a conductive top bonding pad layer is formed on the first device layer;
    providing a continuous second device layer formed on a second substrate, wherein a continuous conductive adhesion layer is formed on the continuous second device layer;
    bonding the first device layer with the second device layer, where the top bonding pad layer on the first device layer is directly connected with the conductive continuous adhesion layer on the continuous second device layer to electrically couple the first device with the continuous second device layer;
    removing the second substrate;
    selectively etching the continuous second device layer and the continuous conductive adhesion layer to form a groove array; and
    filling up the groove array with an insulation material to form a plurality of second devices insulated with each other.

2. The method according to claim 1, wherein the first device comprises a drive circuit comprising a plurality of drive circuits formed on the first substrate, neighboring drive circuits are isolated with by the insulation material; and the continuous second device comprises a continuous photosensitive unit layer; and the plurality of second devices comprise a plurality of photosensitive units arranged in a photosensitive unit array.

3. The method according to claim 1, wherein a material of the top bonding pad layer and a material of the continuous conductive adhesion layer are selected based on a criterion that a heat budget generated in the process of bonding the first device layer with the continuous second device layer does not damage devices already formed.

4. The method according to claim 2, wherein a processing temperature of the process of bonding the first device layer with the continuous second device layer is not higher than 440° C.

5. The method according to claim 1, wherein the top bonding pad layer comprises Al, and the continuous conductive adhesion layer comprises Ge; or, the top bonding pad layer and the continuous conductive adhesion layer comprise Cu; or, a combination of the top bonding pad layer and the continuous conductive adhesion layer is Au—In or Au—Si.

6. The method according to claim 1, wherein the top bonding pad layer is a continuous layer before the first device layer is bonded with the continuous second device layer; and the top bonding pad layer is developed into a plurality of top bonding pads isolated from each other in the process of selectively etching the continuous second device layer and the continuous conductive adhesion layer.

7. The method according to claim 1, wherein the top bonding pad layer is developed into a plurality of top bonding pads before the first device layer is bonded with the continuous second device layer.

8. The method according to claim 2, wherein the top bonding pad layer is developed into a plurality of top bonding pads before the first device layer is bonded with the continuous second device layer, each top bonding pad comprises two metal layers, an upper smaller metal layer used to be connected with the conductive adhesion layer, and a bottom larger metal layer used as a light-reflection layer.

9. The method according to claim 1, wherein the second substrate is removed using a dry etch process, a wet etch process or a polishing process.

10. The method according to claim 2, wherein the photosensitive unit layer is a photo diode layer, and a stop layer is formed between the second substrate and the photo diode layer to avoid damaging the photo diode layer in the process of removing the second substrate.

11. The method according to claim 2, wherein the photosensitive unit layer is a photo diode layer, an ion-implanting layer is formed between the second substrate and the photo diode layer, and the process of removing the second substrate comprises separating the second substrate from the second device layer using the ion-implanting layer as an interface.

12. The method according to claim 1, wherein the first substrate and the second substrate are selected from a group consisting of silicon substrate and silicon-on-insulator substrate.

13. The method according to claim 2, wherein the photosensitive unit layer is a photo diode layer comprising a P-type doping layer and a N-type doping layer, or comprising a P-type doping layer, an I-type layer and a N-type doping layer, and the photo diode layer comprises Si, Ge, SiC, GeAs, InP or other semiconductor compounds.

14. The method according to claim 2, wherein the photosensitive unit layer is a photo diode layer, the plurality of second devices isolated with each other are the plurality of photosensitive units, and the plurality of photosensitive units are a plurality of photo diodes; and after the plurality of photo diodes are formed, a front electrode, a light-filter layer and micro lenses are formed on the photo diodes, and the front electrode is a nonopaque conductive oxide layer or a heavily-doped Ge layer.

15. The method according to claim 2, wherein after the groove array is formed and before the insulation material is filled into the groove array, isolating ions are implanted into the photosensitive unit layer, so that the isolating ions are doped into portions of the photosensitive unit layer which are close to sidewalls of the groove array.

16. The method according to claim 1, wherein the first device layer is a drive circuit array and the second device layer is a memory array.

17. The method according to claim 16, wherein the memory array comprises NAND memory units or NOR memory units.

* * * * *